(12) United States Patent
Ishii et al.

(10) Patent No.: US 6,498,765 B2
(45) Date of Patent: Dec. 24, 2002

(54) SEMICONDUCTOR INTEGRATED CIRCUIT

(75) Inventors: Yuichiro Ishii, Tokyo (JP); Atsushi Miyanishi, Tokyo (JP); Yoshiyuki Ota, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/838,269

(22) Filed: Apr. 20, 2001

(65) Prior Publication Data

US 2002/0021615 A1 Feb. 21, 2002

(30) Foreign Application Priority Data

Aug. 8, 2000 (JP) ........................................ 2000-239406

(51) Int. Cl.[7] ................................................. G11C 8/00
(52) U.S. Cl. .................. 365/233; 365/189.05; 365/194; 327/141
(58) Field of Search ........................... 365/233, 189.05, 365/194; 327/141

(56) References Cited

U.S. PATENT DOCUMENTS

| | | | | |
|---|---|---|---|---|
| 6,005,825 A | * | 12/1999 | Lee et al. ..................... | 365/194 |
| 6,084,802 A | * | 7/2000 | Shinozaki ............... | 365/189.05 |
| 6,175,532 B1 | * | 1/2001 | Ooishi .................... | 365/189.05 |
| 6,275,444 B1 | * | 8/2001 | Nakano et al. ............. | 365/233 |
| 6,292,410 B1 | * | 9/2001 | Yi et al. .................. | 365/189.05 |
| 6,317,381 B1 | * | 11/2001 | Gans et al. ................. | 365/233 |

FOREIGN PATENT DOCUMENTS

| | | |
|---|---|---|
| JP | 6-202932 | 7/1994 |
| JP | 10-144074 | 5/1998 |
| JP | 11-126479 | 5/1999 |

* cited by examiner

Primary Examiner—Richard Elms
Assistant Examiner—Toan Le
(74) Attorney, Agent, or Firm—Oblon, Spivak, McClelland, Maier & Neustadt, P.C.

(57) ABSTRACT

A pulse generation circuit (11) generates a pulse signal (S11) of "L" with a rise of a clock signal (CLOCK) as a trigger. A latch circuit (12) changes a latch signal (S12) fry "L" to "H" on the basis of the pulse signal (11) of "L". Inverters (G10, G11) output a signal (XDEC) on the basis of the latch signal (S12). Even when the generation of the "L" pulse of the pulse signal (S11) is terminated and the pulse signal (S11) returns to "H", the latch circuit (12) is in a data holding state to sustain the latch signal (S12) of "H" during a period while the signal READY takes "H". With this constitution, it is possible to provide a semiconductor integrated circuit having a control unit which can output an operation control signal in synchronization with the clock signal without being constrained by the time length of "H" ("L") period of the clock signal.

12 Claims, 12 Drawing Sheets

SEMICONDUCTOR INTEGRATED CIRCUIT

BACKGROUND OF THE INVENTION

1. Field of the Invention

The present invention relates to a semiconductor integrated circuit such as a semiconductor memory device, and more particularly to a clock-synchronous RAM and the like.

2. Description of the Background Art

FIG. 11 is a block diagram showing an overall constitution of an SRAM (SP-SRAM) with one read/write port. As shown in FIG. 11, the SP-SRAM consists of a word line driver 2, an I/O circuit 3, a memory cell array 4, a timing generation circuit 6 and a delay circuit 7.

The memory cell array 4 consists of a plurality of memory cells (not shown) arranged in matrix, and connected to a common word line (not shown) in a unit of row and connected to a common bit line (not shown) in a unit of column. The word line driver 2 receives a signal XDEC serving as a word line drive control signal, comes into an active state when the signal XDEC takes "H" (High Level), and selectively activates (opens) the word line on the basis of an externally-received address signal AD.

The I/O circuit 3 includes an input/output buffer, a sense amplifier, a write driver and a precharge circuit (all of which are not shown) therein. The sense amplifier comes into an active state when a sense amplifier activation signal SE takes "H", and when in the active state, it detects and amplifies read data given from a selected memory cell in the memory cell array and externally outputs the data as output data. The write driver comes into an active state when a driver control signal WE takes "H", when in the active state, it outputs write data based on externally-received input data to the selected memory cell through a pair of bit lines. The precharge circuit comes into an active state when a precharge control signal PC takes "H", and when in the active state, it precharges the pair of bit lines in the memory cell array 4 to a predetermined potential.

The timing generation circuit 6 receives a clock signal CLOCK, a signal WEC and a signal READY and outputs the signal XDEC, the: signal SE, the signal WE, the signal PC and a signal DUM_XDEC all of which serve as control signals.

The delay circuit 7 outputs the signal READY of "L" (Low Level) after a delay time ΔT2 passes from the point of time when the signal DUM_XDEC changes from "H" to "L" and outputs the signal READY of "H" immediately after the signal DUM_XDEC changes from "L" to "H". The delay time ΔT2 is so set as to satisfy both a time required to activate the word line in the memory cell array 4 and detect and amplify the read data by the sense amplifier in a read mode and a time required to store the write data given from the write driver into the selected memory cell in a write mode.

FIG. 12 is a circuit diagram showing an internal configuration of the timing generation circuit 6 shown in FIG. 11. As shown in FIG. 12, inverters G51 and G52 are connected in series, and an input of the inverter G51 receives the clock signal CLOCK. One input of a NAND gate G54 receives an output from the inverter G52 and the other input receives the signal READY. An input of an inverter G56 receives an output from the NAND gate G54 and an input of an inverter G57 receives an output from the inverter G56.

On the other hand, an input of an inverter G55 receives the signal READY. One input of a NAND gate G58 receives an output from the inverter G55 and the other input receives the output from the inverter G52. An input of an inverter G59 receives an output from the NAND gate G58. One input of a NOR gate G60 receives the signal XDEC and the other input receives an output from the inverter G59.

Further, an input of an inverter G53 receives the signal WEC. One input of a NOR gate G61 receives the signal WEC and the other input receives the output from the NAND gate G54. One input of a NOR gate G62 receives an output from the inverter G53 and the other input receives the output from the NAND gate G54. Inverters G63 and G64 are connected in series, and an input of the inverter G63 receives an output from the NOR gate G61. Inverters G65 and G66 are connected in series, and an input of the inverter G65 receives an output from the NOR gate G62.

An output of the inverter G57 is outputted as the precharge control signal PC. An output of the inverter G56 is outputted as the signal XDEC. An output of the NOR gate G60 is outputted as the signal DUM_XDEC. An output of the inverter G64 is outputted as the sense amplifier activation signal SE. An output of the inverter G66 is outputted as the driver control signal WE.

FIG. 13 is a timing chart showing a generating operation of the timing generation circuit 6 shown in FIG. 12. Referring to FIG. 13, the operation of the timing generation circuit 6 will be discussed below.

First, in an initial state, the signal XDEC is set to "L", the signal READY is set to "H" and the signal DUM_XDEC is set to "H". Further, it is assumed here that the timing generation circuit 6 is in a read mode with the write control signal WEC of "L". In the read mode, the driver control signal WE is fixed to "L".

In the initial state, when the clock signal CLOCK rises to "H", the signal XDEC changes to "H" (change CH11) with rise of the clock signal CLOCK to "H" as a trigger since the signal READY takes "H".

At the same time as the change CH11, the precharge control signal PC and the signal DUM_XDEC fall to "L" and the sense amplifier activation signal SE rises to "H".

When the signal XDEC takes "H", the word line driver 2 comes into an active state and selectively drives the word line (into the active state) on the basis of the externally-received address signal AD.

At the same time, the precharge circuit comes into an inactive state with the precharge control signal PC of "L", and the sense amplifier comes into an active state with the sense amplifier activation signal SE of "H" to externally output the read data from the selected memory cell as the output data which is detected and amplified, starting a read operation.

Then, after the delay time ΔT2 passes from the rise of the signal XDEC (the fall of the signal DUM_XDEC), the signal READY falls to "L" (change CH12).

The signal XDEC falls to "L" (change CH13) with the fall of the signal READY to "L". At the same time, the precharge control signal PC rises to "H" and the sense amplifier activation signal SE falls to "L".

With the signal XDEC of "L", the word line driver 2 comes into an inactive state to stop driving all the word lines, and with the sense amplifier activation signal SE of "L", the sense amplifier comes into an inactive state, terminating the read operation. On the other hand, with the precharge control signal PC of "H", a precharge operation on the pair of bit lines restarts.

Further, since the signal READY takes "L", the signal DUM_XDEC sustains "L" even when the signal XDEC falls to "L".

After that, when the clock signal CLOCK falls to "L", the signal DUM_XDEC rises to "H" (change CH14) with fall of the clock signal CLOCK to "L" as a trigger.

Further, after the signal DUM_XDEC rises to "H", the signal READY rises to "H" (change CH15) immediately. As a result, the signal XDEC comes into "L" and the signal READY and the signal DUM_XDEC come into "H", returning to the initial state. After that, in synchronization with the clock signals CLOCK, the above operation is repeated.

Thus, the timing generation circuit 6 generates the signal XDEC, the precharge control signal PC and the sense amplifier activation signal SE all of which serve as the operation control signals, performing a timing control of the read operation.

Further, with the signal WEC of "H", the timing generation circuit 6 comes into a write mode. Specifically, the timing generation circuit 6 generates the sense amplifier activation signal SE which is fixed to "L", the driver control signal WE which changes like the sense amplifier activation signal SE in the read mode, and the signal XDEC and the precharge control signal Pc which change like those in the read mode, performing a timing control of the write operation.

Since the timing generation circuit 6 in the background art has a circuit configuration in which the logics and the clocks are combined as discussed above, the timing of generating the control signals (XDEC, WE, SE and PC) generated in the timing generation circuit 6 is constrained by the time length of "H" ("L") period of the clock signal CLOCK and a high-speed operation of RAM is disadvantageously impeded.

For example, during a period while the signal XDEC takes "H" and the signal READY takes "H" after the signal change CH11 of FIG. 13 and the word line is driven to perform the read operation (write operation), when the clock signal CLOCK falls to "L", the signal XDEC falls to "L" and accordingly the driving operation of the word line is forcedly terminated, to fail the read operation (write operation). Therefore, at least until the signal XDEC falls with the fall of the signal READY as a trigger, the clock signal CLOCK needs to sustain "H".

SUMMARY OF THE INVENTION

The present invention is directed to a semiconductor integrated circuit. According to a first aspect of the present invention, the semiconductor integrated circuit comprises: a control unit for generating an operation control signal in synchronization with a clock signal; an operation unit for operating on the basis of the operation control signal, and in the semiconductor integrated circuit of the first aspect, the control unit outputs the operation control signal which is timing-controlled only by a single predetermined kind of signal shift of the clock signal.

According to a second aspect of the present invention, in the semiconductor integrated circuit of the first aspect, the control unit comprises a pulse generation circuit receiving the clock signal, for generating a pulse signal taking a first level or a second level, the pulse signal coming into the first level for a predetermined period from the single predetermined kind of signal shift of the clock signal; a latch circuit receiving the pulse signal, for outputting a latch signal having a signal value based on the first level in response to the pulse signal of the first level, and after that coming into a data holding state for a predetermined period to hold the signal value of the latch signal regardless of the level of the pulse signal; and a control signal generation circuit for generating the operation control signal on the basis of the latch signal.

According to a third aspect of the present invention, in the semiconductor integrated circuit of the second aspect, the control unit further comprises an operation control signal high-speed setting circuit for making the control signal generation circuit generate the operation control signal which is generated by the control signal generation circuit in response to the latch signal in advance before the control signal generation circuit is driven by the latch signal, when the pulse signal takes the first level.

According to a fourth aspect of the present invention, in the semiconductor integrated circuit of the second aspect, the control unit further comprises an auxiliary signal outputting circuit for outputting an auxiliary signal on the basis of the operation control signal, and the latch circuit releases the data holding state when the auxiliary signal takes a predetermined signal value.

According to a fifth aspect of the present invention, in the semiconductor integrated circuit of the fourth aspect, the control unit further comprises an operation control signal high-speed setting circuit for making the control signal generation circuit generate the operation control signal which is generated by the control signal generation circuit in response to the latch signal in advance before the control signal generation circuit is driven by the latch signal, when the auxiliary signal takes the predetermined signal value.

According to a sixth aspect of the present invention, in the semiconductor integrated circuit of the fourth or fifth aspect, the auxiliary signal outputting circuit includes a delay circuit receiving the operation control signal, for outputting the auxiliary signal of the predetermined signal value on the basis of a delayed signal of the operation control signal.

Preferably, the operation unit includes a semiconductor memory unit constituted of a memory cell array having a plurality of memory cells arranged in matrix.

Preferably, the operation control signal includes an operation control signal for selecting the memory cells of the memory cell array.

Preferably, the operation control signal high-speed setting circuit includes a first transistor having one electrode receiving a fixed potential, the other electrode connected to a node which determines a signal value of the operation control signal, and a control electrode receiving a pulse-related signal which takes a signal value corresponding to a signal value of the pulse signal, and the first transistor comes into an on state when the pulse-related signal takes a signal value set correspondingly to the first level of the pulse signal.

Preferably, the latch circuit has a first NAND gate and a second NAND gate, the first NAND gate has one input receiving the pulse signal and the other input receiving an output from the second NAND gate and outputs the latch signal, the second NAND gate has one input receiving the latch signal and the other input receiving the auxiliary signal, the first level includes "L" level, and the predetermined level includes "L" level.

Preferably, the latch circuit has a first NOR gate and a second NOR gate, the first NOR gate has one input receiving the pulse signal and the other input receiving an output from the second NOR gate and outputs the latch signal, the second NOR gate has one input receiving the latch signal and the other input receiving an inverted signal of the auxiliary signal, the first level includes "H" level, and the predetermined level includes "L" level.

Preferably, the operation control signal high-speed setting circuit includes a second transistor having one electrode receiving a fixed potential, the other electrode connected to a node which determines a signal value of the operation control signal, and a control electrode receiving an auxiliary-related signal which takes a signal value corresponding to a signal value of the auxiliary signal, and the second transistor comes into an on state when the auxiliary-related signal takes a signal value set correspondingly to the predetermined level of the auxiliary signal.

In the semiconductor integrated circuit of the first aspect of the present invention, since the control unit can output the operation control signal which is unconstrained by a signal level sustain period of the clock signal by outputting the operation control signal which is timing-controlled only by the single predetermined kind of signal shift of the clock signal, it is possible to achieve a high-speed operation of the operation unit.

In the semiconductor integrated circuit of the second aspect of the present invention, the latch circuit of the control unit receives the pulse signal which comes into he first level for a predetermined period from the single predetermined kind of signal shift of the clock signal, with the pulse signal of the first level unconditionally taken, outputs the latch signal having the signal value based on the first level, and then comes into the data holding state for a predetermined period to hold the signal value of the latch signal regardless of a signal value of the pulse signal.

Therefore, it is possible to generate the operation control signal on the basis of the signal value of the latch signal at a timing depending only on the single predetermined kind of signal shift of the clock signal.

In the semiconductor integrated circuit of the third aspect of the present invention, since the operation control signal high-speed setting circuit makes the control signal generation circuit generate the operation control signal which is generated by the control signal generation circuit in response to the latch signal in advance before the control signal generation circuit is driven by the latch signal when the pulse signal takes the first level, it is possible to set the signal value of the operation control signal at high speed with the single predetermined kind of signal shift (change of the pulse signal from the second level to the first level) of the clock signal as a trigger.

In the semiconductor integrated circuit of the fourth aspect of the present invention, since the latch circuit releases the data holding state when the auxiliary signal takes the predetermined signal value, it is possible to control the timing of terminating the output of the latch signal having the signal value based on the first level with the auxiliary signal.

In the semiconductor integrated circuit of the fifth aspect of the present invention, since the operation control signal high-speed setting circuit makes the control signal generation circuit generate the operation control signal which is generated by the control signal generation circuit in response to the latch signal in advance before the control signal generation circuit is driven by the latch signal when the auxiliary signal takes the predetermined signal value, it is possible to set the signal value of the operation control signal at high speed with a signal change of the auxiliary signal to a predetermined signal value as a trigger.

In the semiconductor integrated circuit of the sixth aspect of the present invention, since the delay circuit outputs the auxiliary signal having the predetermined signal value on the basis of the delayed signal of the operation control signal, it is possible to set the timing of outputting the auxiliary signal of predetermined level, depending on a signal change of the operation control signal.

An object of the present invention is to provide a semiconductor integrated circuit having a control unit which generates an operation control signal in synchronization with a clock signal for an operation unit of a RAM such as a memory cell array, a word line driver and an I/O circuit and is unconstrained by the time length of "H" ("L") period of the clock signal.

These and other objects, features, aspects and advantages of the present invention will become more apparent from the following detailed description of the present invention when taken in conjunction with the accompanying drawings.

DESCRIPTION OF THE PREFERRED EMBODIMENTS

The First Preferred Embodiment

Figure 1:
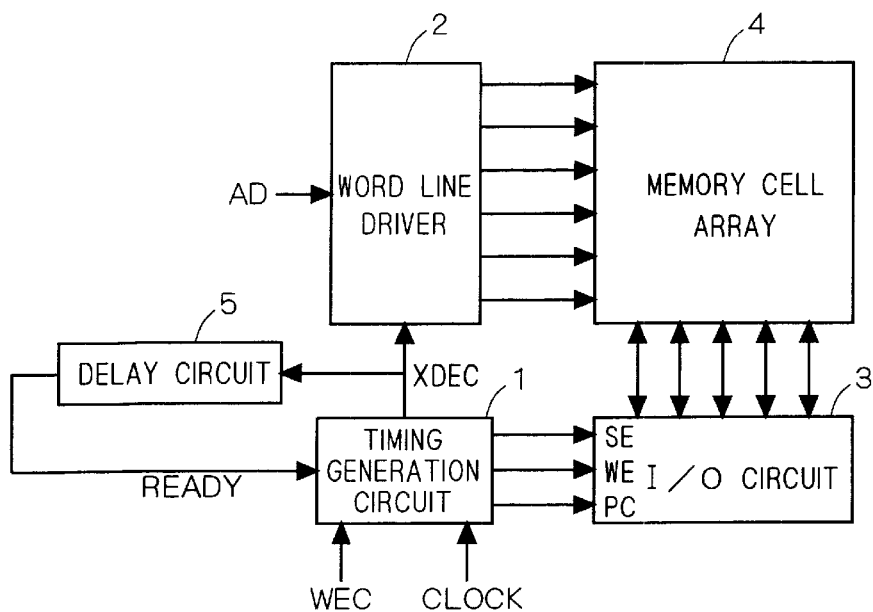
FIG. 1 is a block diagram showing a constitution of a RAM in accordance with a first preferred embodiment of the present invention.

FIG. 1 is a block diagram showing a constitution of a RAM (semiconductor integrated circuit) in accordance with the first preferred embodiment of the present invention.

As shown in FIG. 1, a timing generation circuit 1 receives the clock signal CLOCK, the write control signal WEC and the signal READY (auxiliary signal) and outputs the signal XDEC, the signal SE, the signal WE and the signal PC all of which serve as operation control signals.

A delay circuit 5 outputs the signal READY of "L" after a delay time ΔT1 passes from the change of the signal XDEC from "L" to "H" and outputs the signal READY of "H" immediately after the change of the signal XDEC from "H" to "L". The delay time ΔT1 is so set as to satisfy both a time required to selectively activate the word line in the memory cell array 4 and detect and amplify the read data by the sense amplifier in a read mode and a time required to store the write data given from the write driver into the selected memory cell in a write mode.

Figure 11:
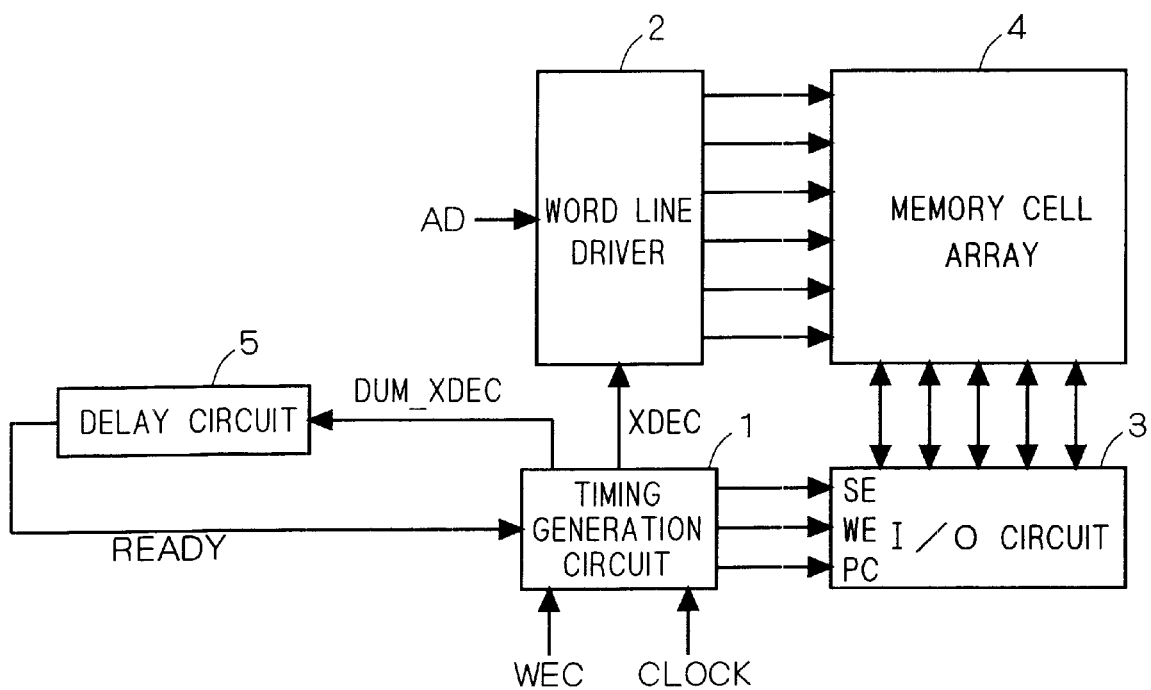
FIG. 11 is a block diagram showing a constitution of a RAM in the background art.
Figure 12:
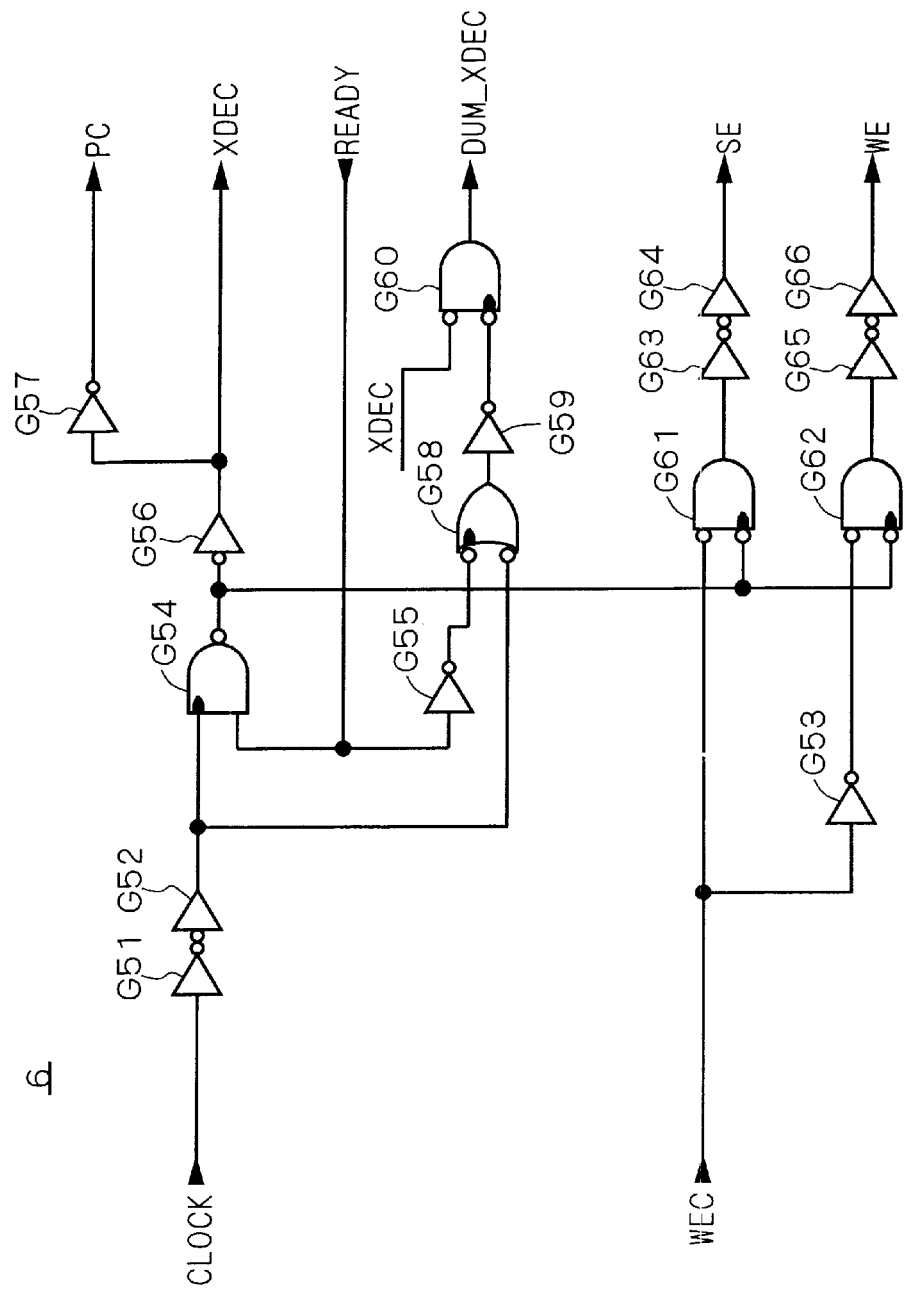
FIG. 12 is a circuit diagram showing an internal configuration of a timing generation circuit of FIG. 11.
Figure 13:
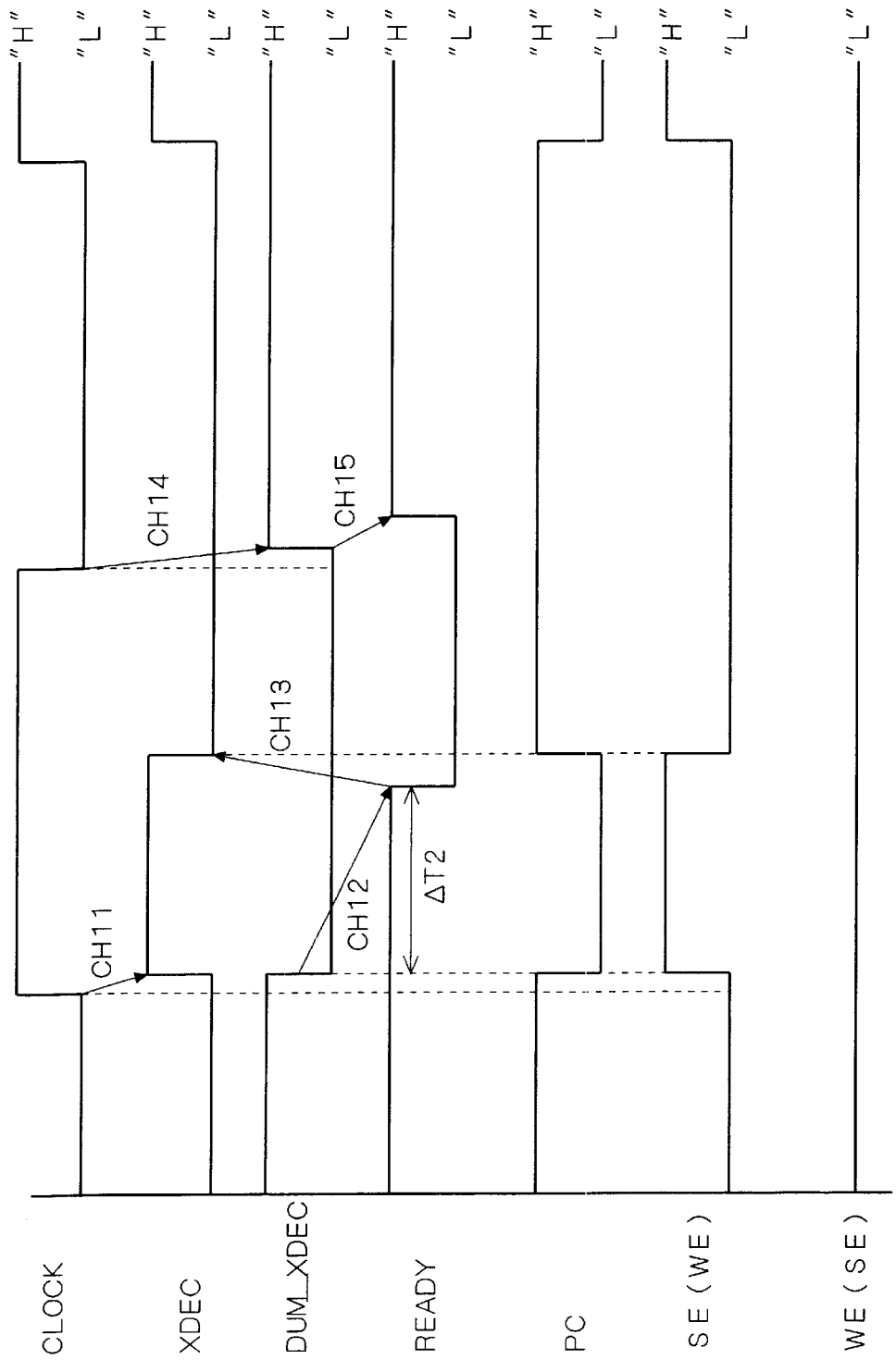
FIG. 13 is a timing chart showing a control signal generating operation of the timing generation circuit of FIG. 12.

The timing generation circuit 1 and the delay circuit 5 constitute a control unit for generating the operation control signal. On the other hand, the word line driver 2, the I/O circuit 3 and the memory cell array 4 which constitute an operation unit are the same as those shown in FIG. 11 and discussion thereof will be omitted. A precharge circuit in the I/O circuit 3, however, is different from that in the background art and comes into an active state with "L".

Figure 2:
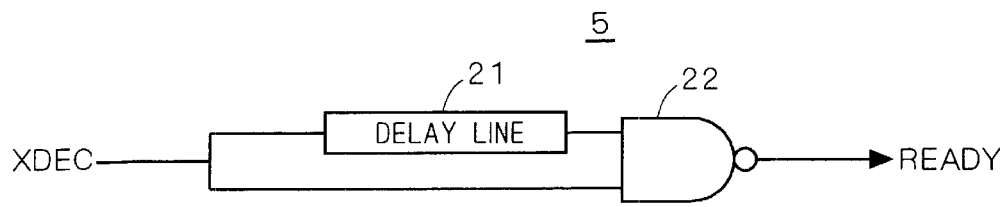
FIG. 2 is a circuit diagram showing an exemplary constitution of a delay circuit of FIG. 1.

FIG. 2 is a circuit diagram showing an exemplary constitution of the delay circuit shown in FIG. 1. As shown in FIG. 2, one input of a NAND gate 22 receives the signal XDEC through a delay line 21 and the other directly receives the signal XDEC. Assuming here that a delay time of the delay line 21 is set to the delay time ΔT1, the delay circuit 5 performs the above-discussed delay operation. Herein, no account of a signal propagation delay time by the NAND gate 22 is taken.

Figure 3:
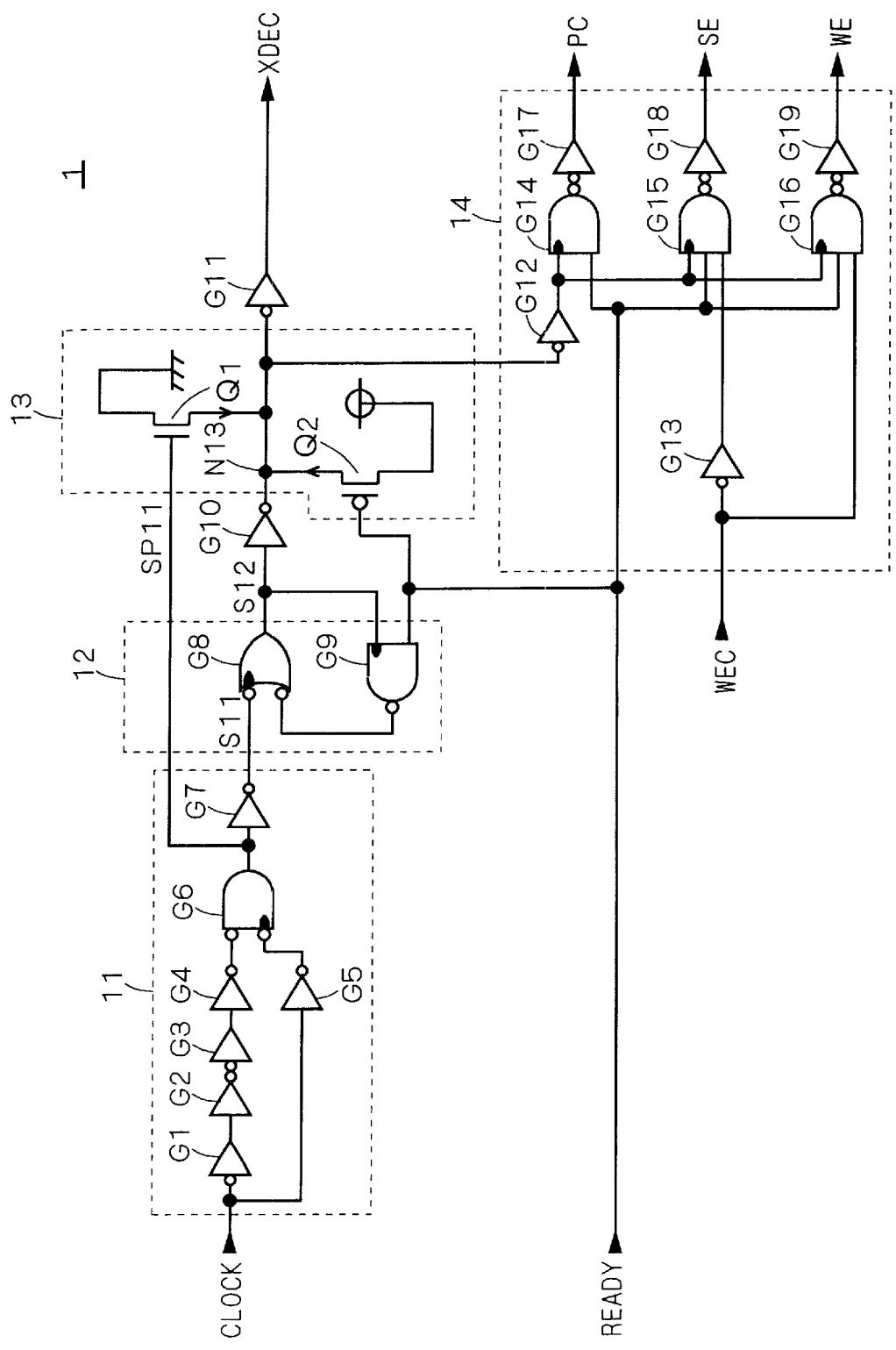
FIG. 3 is a circuit diagram showing an internal configuration of a timing generation circuit in accordance with the first preferred embodiment of the present invention.

FIG. 3 is a circuit diagram showing an internal configuration of the timing generation circuit 1 in accordance with the first preferred embodiment of the present invention. As shown in FIG. 3, The timing generation circuit 1 comprises a pulse generation circuit 11, a latch circuit 12, a high-speed path circuit 13, a control signal generation circuit 14 and inverters G10 and G11 for signal level control.

The pulse generation circuit 11 consists of inverters G1 to G5 and G7 and a NOR gate G6. The inverters G1 to G4 are connected in series and an input of the inverter G1 receives the clock signal CLOCK. An input of the inverter G5 receives the clock signal CLOCK. One input of the NOR gate G6 receives an output from the inverter G4 and the other input receives an output from the inverter G5. An input of the inverter G7 receives an output from the NOR gate G6. An output of the inverter G7 is outputted as a pulse signal S11 to the latch circuit 12 and an output of the NOR gate G6 is outputted as a prior pulse signal SP11 to the high-speed path circuit 13. Therefore, the prior pulse signal SP11 is an inverted signal of the pulse signal S11.

The latch circuit 12 consists of NAND gates G8 and G9. One input of the NAND gate G8 receives the pulse signal S11 and the other input receives an output from the NAND gate G9. One input of the NAND gate G9 receives an output from the NAND gate G8 and the other input receives the signal READY. The output of the NAND gate G8 is outputted as a latch signal S12 for the latch circuit 12.

The high-speed path circuit 13 consists of an NMOS transistor Q1 and a PMOS transistor Q2, and a node N13 receives the latch signal S12 through the inverter G10. The NMOS transistor Q1 has a source connected to the ground, a drain connected to the node N13 and a gate receiving the prior pulse signal SP11. The PMOS transistor Q2 has a source connected to a power supply, a drain connected to the node N13 and a gate receiving the signal READY. A signal given from the node N13 of the high-speed path circuit 13 is outputted as the signal XDEC through the inverter G11.

The control signal generation circuit 14 consists of inverters G12, G13 and G17 to G19 and NAND gates G14 to G16. An input of the inverter G12 is connected to the node N13 of the high-speed path circuit 13, and an input of the inverter G13 receives the signal WEC. One input of the NAND gate G14 receives an output from the inverter G12 and the other input receives the signal READY The NAND gate G15 has three inputs, i.e., the first input receiving the output from the inverter G12, the second input receiving the signal READY and the third input receiving an output from the inverter G13. The NAND gate G16 has three inputs, i.e., the first input receiving the output from the inverter G12, the second input receiving the signal READY and the third input receiving the signal WEC.

Inputs of the inverters G17 to G19 receive outputs from the NAND gates G14 to G16, and outputs of the inverters G17 to G19 are outputted as th precharge control signal PC, the sense amplifier activation signal SE and the driver control signal WE, respectively.

Figure 4:
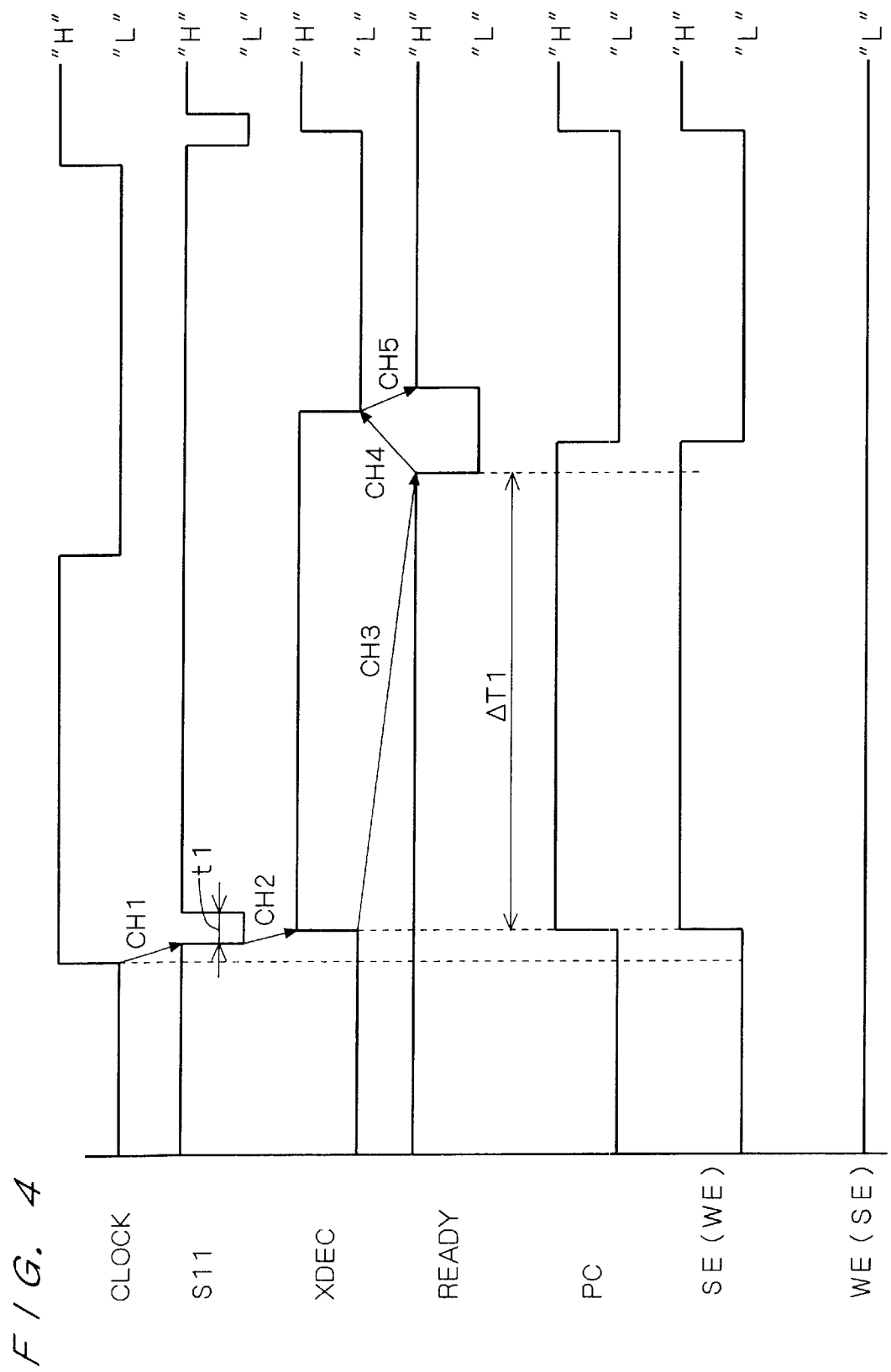
FIG. 4 is a timing chart showing a control signal generating operation of the timing generation circuit in accordance with the first preferred embodiment of the present invention.

FIG. 4 is a timing chart showing a control signal generating operation of the timing generation circuit 1 in accordance with the first preferred embodiment of the present invention. Referring to FIG. 4, an operation of the timing generation circuit of the first preferred embodiment will be discussed below.

First, in an initial state, the signal XDEC is set to "L" (the latch signal S12 is set to "L") and the signal READY is set to "H". Further, it is assumed here that the timing generation circuit 1 is in a read mode with the write control signal WEC of "L". In the read mode, the driver control signal WE is fixed to "L".

In the initial state, when the clock signal CLOCK rises to "H", the pulse signal S11 generates a pulse which comes into "L" (change CH1) during a period t1 with this rise as a trigger. At the same time, the prior pulse signal SP11 generates a pulse which comes into "H" during the period t1 (not shown in FIG. 4). The period t1 corresponds to a time period obtained by subtracting a signal propagation time of the inverter G5 from a signal propagation time of the inverters G1 to G4.

When a pulse of "H" of the prior pulse signal SP 11 is applied to the gate of the NMOS transistor Q1, the NMOS transistor Q1 is turned on and the node N13 is immediately set to "L", whereby the signal XDEC rises to "H" (change CH2).

In parallel with this, the latch circuit 12 receiving the pulse signal S11 of "L" latches the pulse signal S11 and changes the latch signal S12 from "L" to "H" on the basis of the pulse signal S11 of "L". As a result, the signal XDEC which is obtaining by propagating latch signal S12 through the inverters G10 and G11 is stabilized to "H". In other words, the inverters G10 and G11 serve as a control signal generation circuit for the signal XDEC.

On the other hand, when the node N13 is set to "L", the precharge control signal PC and the sense amplifier activation signal SE rise to "H".

Even when the generation of the "L" pulse of the pulse signal S11 is terminated and the pulse signal S11 returns to "H", the latch circuit 12 is in a data holding state to sustain the latch signal S12 of "H" because the signal READY takes "H".

When the signal XDEC takes "H", the word line driver 2 comes into an active state and selectively drives the word line (to an active state) on the basis of the externally-received address signal AD.

At the same time, the precharge circuit comes into an inactive state with the precharge control signal PC of "H", and the sense amplifier comes into an active state with the sense amplifier activation signal SE of "H" to externally output the read data from the selected memory cell as the output data which is detected and amplified, starting a read operation.

Then, after the delay time ΔT1 passes from the rise of the signal XDEC, the signal READY falls to "L" (change CH3) by the delay circuit 5.

The precharge control signal PC and the sense amplifier activation signal SE fall to "L" with the fall of the signal READY to "L" as a trigger.

When a pulse of "L" of the signal READY is applied to the gate of the PMOS transistor Q2, the PMOS transistor Q2 is turned on and the node N13 is immediately set to "H", whereby the signal XDEC falls to "L" (change CH4).

In parallel with this, the data holding state of the latch circuit 12 is released by the fall of the signal READY to "L" and the latch signal S12 falls to "L" on the basis of the pulse signal S11 of "H". As a result, the signal XDEC is stabilized to "L".

Therefore, the signal XDEC comes into "L" to inactivate the word line driver 2, stopping the driving operation of all the word lines and the sense amplifier activation signal SE comes into "L" to inactivate the sense amplifier, terminating the read operation. On the other hand, the precharge control signal PC comes into "L to restart the precharge operation for a pair of bit lines.

The signal READY rises to "H" (change CH5) immediately after the rise of the signal XDEC. Even when the signal READY is returned to "H", the latch circuit 12 comes into a data holding state to sustain the latch signal S12 of "L" because the pulse signal S11 takes "H". Therefore, the signal XDEC sustains "L". In other words, the signal XDEC comes into "L" and the signal READY comes into "H", returning to the initial state. After that, in synchronization with the rise of the clock signals CLOCK to "H", the above operation is repeated.

Thus, the timing generation circuit 1 generates the signal XDEC, the precharge control signal PC and the sense amplifier activation signal SE all of which serve as the operation control signals, performing a timing control of the read operation.

Further, with the signal WEC of "H", the timing generation circuit 1 comes into a write mode. Specifically, the timing generation circuit 1 generates the sense amplifier activation signal SE which is fixed to "L", the driver control signal WE which changes like the sense amplifier activation signal SE in the read mode, and the signal XDEC and the precharge control signal PC which change like those in the read mode, performing a timing control of the write operation.

Thus, since the timing generation circuit 1 of the first preferred embodiment generates the operation control signals (the signals XDEC, PC, SE and WE) depending only on the rising edge of the clock signal CLOCK, it is unconstrained by the time length of "H" and "L" of the clock signal CLOCK, Therefore, since all the period of the clock signal CLOCK is used for the operation of the RAM, it is possible to achieve a high-speed operation of the RAM.

Further, though the word line drive control signal XDEC generally has a heavy load and it takes a long time to drive it, the signal XDEC rises to "H" with the fall of the pulse signal S11 to "L" (the rise of the prior pulse signal SP11 to "H") as a trigger and falls to "L" with the fall of the signal READY to "L" as a trigger by using the high-speed path circuit 13 at high speed in the first preferred embodiment. This will be discussed below in detail.

Since the number of equivalents of signal propagation inverters which contribute to the operation from the rise of the clock signal CLOCK to "H" to the rise of the signal XDEC to "H" by the high-speed path circuit 13 is small, specifically, four (the inverter G5, the NOR gate G6, the NMOS transistor Q1 and the inverter G11), the signal XDEC can rise at high speed with the rise of the clock signal CLOCK as a trigger.

Further, after that, when the prior pulse signal SP11 falls to "L", the NMOS transistor Q1 comes into an off state and the driving operation of the signal XDEC to "H" by the high-speed path circuit 13 is terminated. The signal XDEC, however, can be thereafter stably sustained to "H" by the latch signal S12 (of "H") of the latch circuit 12, and therefore no problem arises.

On the other hand, since the number of equivalents of signal propagation inverters which contribute to the operation from the fall of the signal READY to "L" to the fall of the signal XDEC to "L" by the high-speed path circuit 13 is small, specifically, two (the PMOS transistor Q2 and the inverter G11), the signal XDEC can fall at high speed with the fall of the signal READY as a trigger.

Further, after that, when the signal READY rises to "H", the PMOS transistor Q2 comes into an off state and the driving operation of the signal XDEC to "L" by the high-speed path circuit 13 is terminated. The signal XDEC, however, can be thereafter stably sustained to "L" by the latch signal S12 (of "L") of the latch circuit 12, and therefore no problem arises.

Thus, the high-speed path circuit 13 serving as the operation control signal high-speed setting circuit performs a switching operation between "H" and "L" of the signal XDEC, to further promote the high-speed operation of the RAM.

Further, discussion has been made on the case of the RAM using a current mirror type sense amplifier in the first preferred embodiment. In this case, during the period while the sense amplifier activation signal SE takes "H", the sense amplifier is activated. Other sense amplifier, such as a latch-type sense amplifier, is activated with the falling edge of the sense amplifier activation signal SE as a trigger. The present invention is also effective for a RAM using a sense amplifier other than the current mirror type one.

The Second Preferred Embodiment

Figure 5:
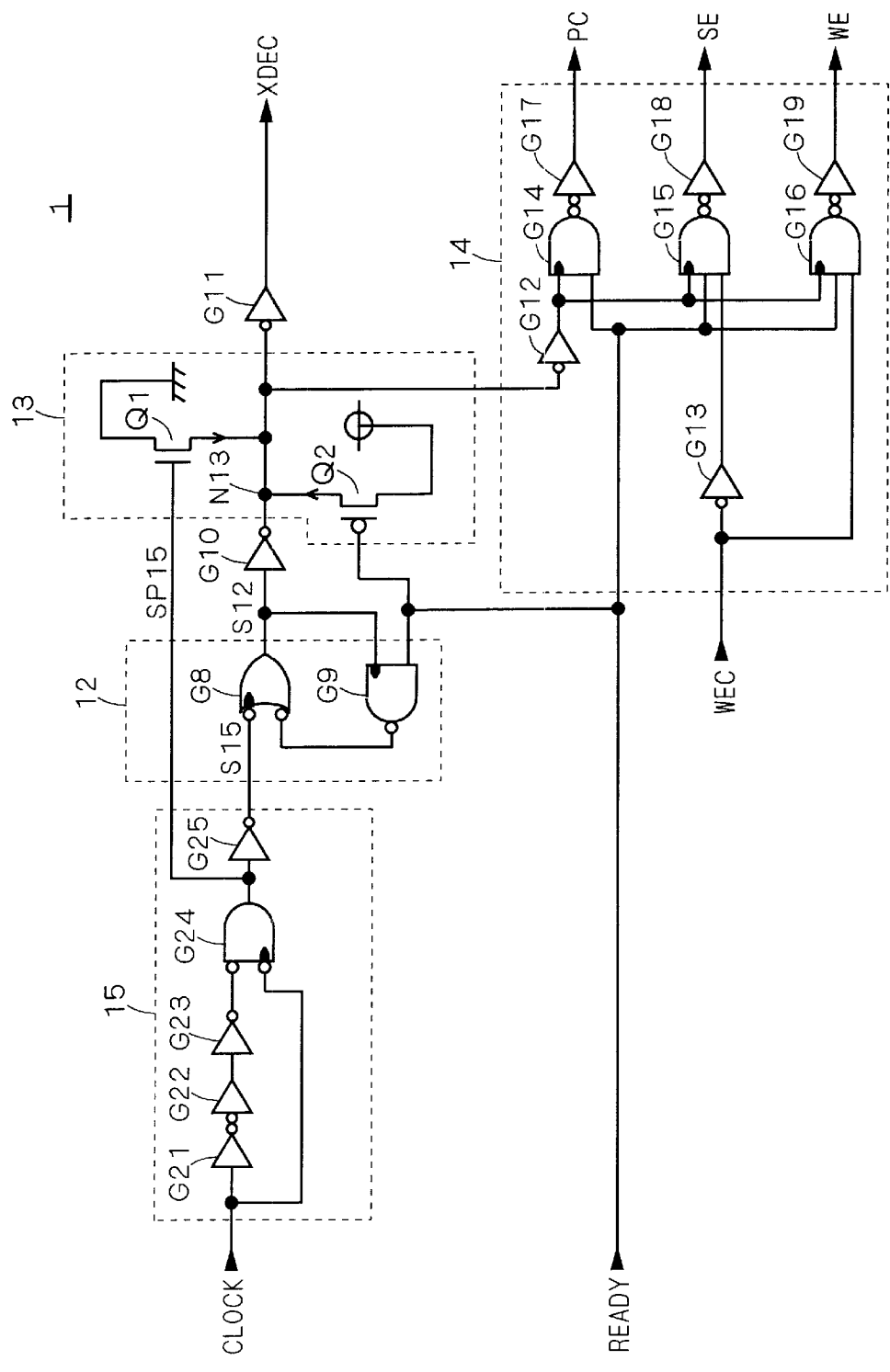
FIG. 5 is a circuit diagram showing an internal configuration of a timing generation circuit in accordance with a second preferred embodiment of the present invention.

FIG. 5 is a circuit diagram showing an internal configuration of a timing generation circuit i n accordance with the second preferred embodiment of the present invention. Further, the overall constitution is the same as that of the first preferred embodiment shown in FIG. 1, except the timing generation circuit.

As shown in FIG. 5, the timing generation circuit 1 comprises a pulse generation circuit 15, the latch circuit 12, the high-speed path circuit 13, the control signal generation circuit 14 and the inverters G10 and G11 for signal level control.

The pulse generation circuit 15 consists of inverters G21 to G23 and G25 and a NOR gate 024. The inverters G21 to G23 are connected in series and an input of the inverter G21 receives the clock signal CLOCK. One input of the NOR gate G24 receives an output from the inverter G23 and the other input receives the clock signal CLOCK. An input of the inverter G25 receives an output from the NOR gate G24. An output of the inverter G25 is outputted as a pulse signal S15 to the latch circuit 12 and an output of the NOR gate G24 is outputted as a prior pulse signal SP15 to the high-speed path circuit 13.

The latch signal 12, the high-speed path circuit 13 and the control signal generation circuit 14 are the same as those of the first preferred embodiment shown in FIG. 3, and discussion thereof will be omitted. The latch circuit 12, however, receives the pulse signal S15, instead of the pulse signal S11, and the high-speed path circuit 13 receives the prior pulse signal SP15, instead of the prior pulse signal SP11.

Figure 6:
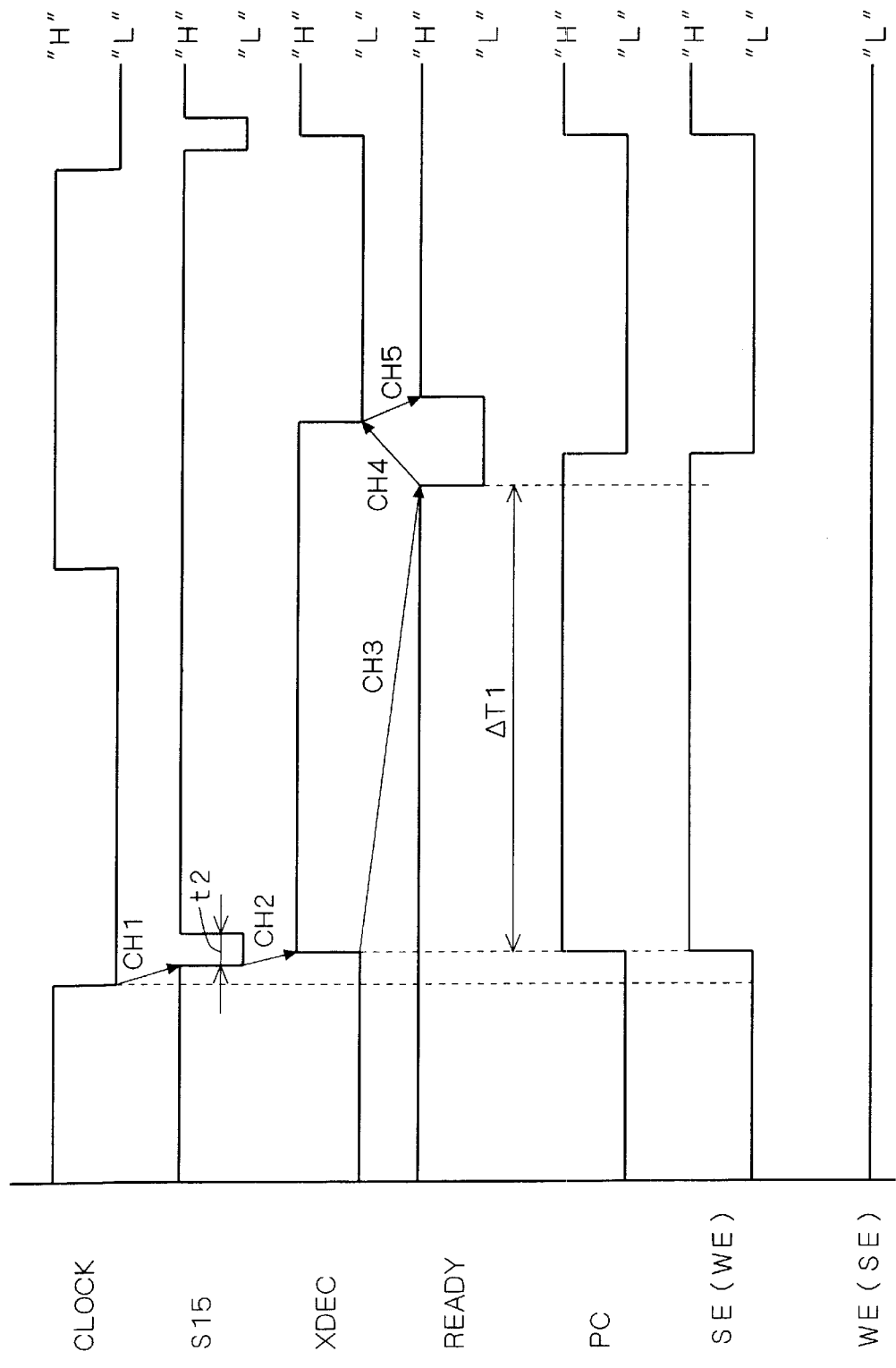
FIG. 6 is a timing chart showing a control signal generating operation of the timing generation circuit in accordance with the second preferred embodiment of the present invention.

FIG. 6 is a timing chart showing a control signal generating operation of the timing generation circuit in accordance with the second preferred embodiment of the present invention. Referring to FIG. 6, an operation of the timing generation circuit of the second preferred embodiment will be discussed below.

First, in an initial state, the signal XDEC is set to "L" and the signal READY is set to "H", like in the first preferred embodiment.

In the initial state, when the clock signal CLOCK falls to "L", the pulse signal S15 generates a pulse which comes into "L" (change CH1) during a period t2 with this fall as a trigger. At the same time, the prior pulse signal SP15 generates a pulse which comes into "H" during the period t2 (not shown in FIG. 6). The period t2 corresponds to a signal propagation time of the inverters G21 to G23.

When a pulse of "H" of the prior pulse signal SP15 is applied to the gate of the NMOS transistor Q1, the NMOS transistor Q1 is turned on and the node N13 is immediately set to "L", whereby the signal XDEC rises to "H" (change CH2).

In parallel with this, the latch circuit 12 receiving the pulse signal S15 of "L" latches the pulse signal S15 and changes the latch signal S12 from "L" to "H" on the basis of the pulse signal S15 of "L". As a result, the signal XDEC which is obtaining by propagating the latch signal S12 through the inverters G10 and G11 is stabilized to "H".

After that, the same operation as shown in FIG. 4 of the first preferred embodiment is performed, except that the pulse signal S11 and the prior pulse signal SP11 are replaced by the pulse signal S15 and the prior pulse signal SP15, respectively.

Thus, the timing generation circuit of the second preferred embodiment generates the operation control signals (the signals XDEC, PC, SE and WE) depending only on the falling edge of the clock signal CLOCK, and produces the same effect as discussed in the first preferred embodiment.

The Third Preferred Embodiment

Figure 7:
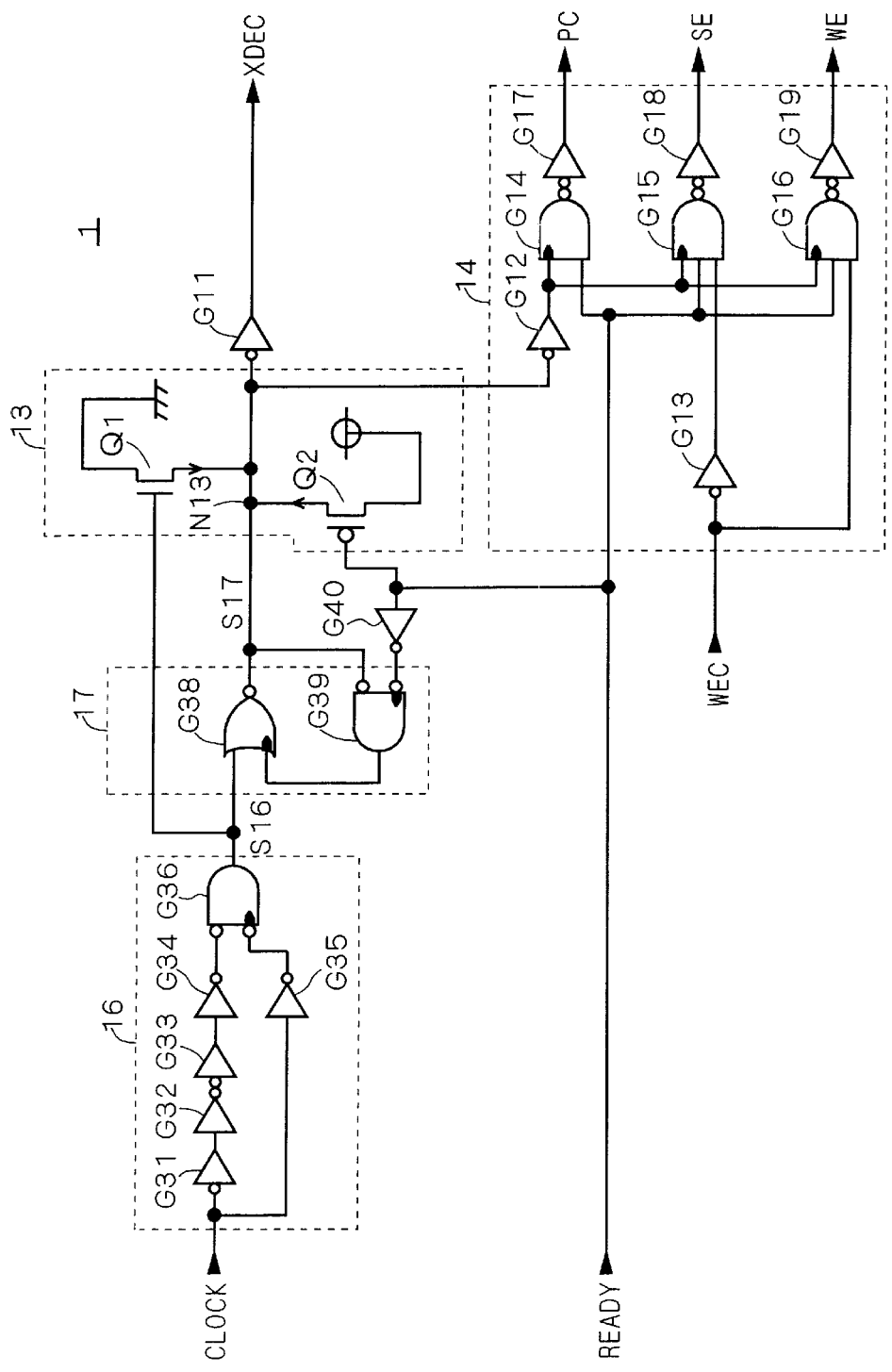
FIG. 7 is a circuit diagram showing an internal configuration of a timing generation circuit in accordance with a third preferred embodiment of the present invention.

FIG. 7 is a circuit diagram showing an internal configuration of a timing generation circuit in a RAM in accordance with the third preferred embodiment of the present invention. Further, the overall constitution is the same as that of the first preferred embodiment shown in FIG. 1, except the timing generation circuit.

As shown in FIG. 7, the timing generation circuit 1 comprises a pulse generation circuit 16, a latch circuit 17, the high-speed path circuit 13, the control signal generation circuit 14 and inverters G11 and G40 for signal level control.

The pulse generation circuit 16 consists of inverters G31 to G35 and a NOR gate G36. The inverters G31 to G34 are connected in series and an input of the inverter G31 receives the clock signal CLOCK. An input of the inverter G35 receives the clock signal CLOCK. One input of the NOR gate G36 receives an output from the inverter G34 and the other input receives an output from the inverter G35. An output of the inverter G36 is outputted as a pulse signal S16 to the latch circuit 17 and the high-speed path circuit 13.

The latch circuit 17 consists of NOR gates G38 and G39. One input of the NOR gate G38 receives the pulse signal S16 and the other input receives an output from the NOR gate G3. One input of the NOR gate G39 receives an output from the NOR gate G38 and the other input receives an inverted signal of the signal READY obtained through the inverter G40. The output of the NOR gate G38 is outputted as a latch signal S17 for the latch circuit 17.

The high-speed path circuit 13 and the control signal generation circuit 14 are the same as those of the first preferred embodiment shown in FIG. 3, and discussion thereof will be omitted. The high-speed path circuit 13, however, receives the pulse signal S16, instead of the prior pulse signal SP11.

Figure 8:
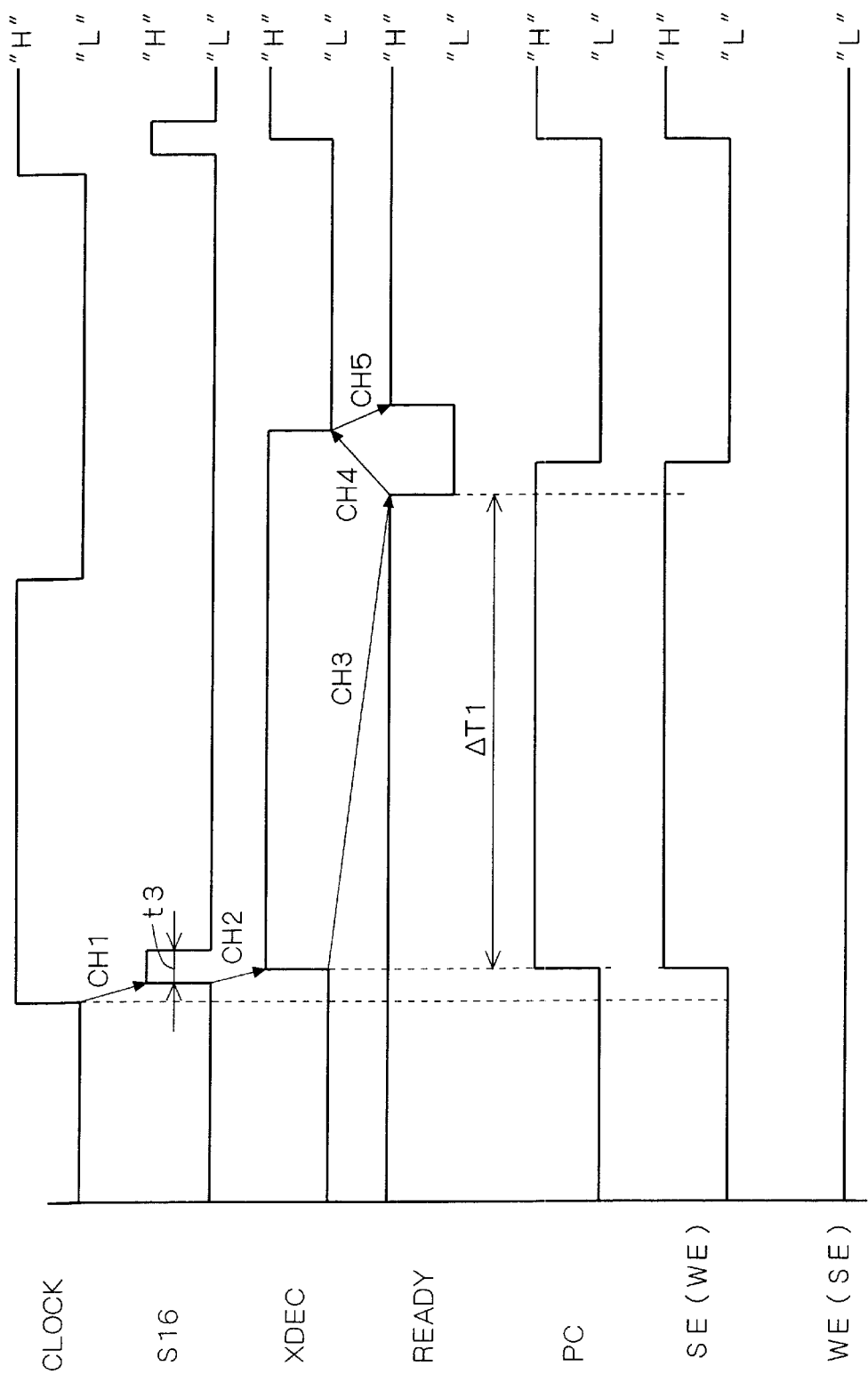
FIG. 8 is a timing chart showing a control signal generating operation of the timing generation circuit in accordance with the third preferred embodiment of the present invention.

FIG. 8 is a timing chart showing a control signal generating operation of the timing generation circuit in accordance with the third preferred embodiment of the present invention. Referring to FIG. 8, an operation of the timing generation circuit of the third preferred embodiment will be discussed below.

First, in an initial state, the signal XDEC is set to "L" (the latch signal 17 is set to "H") and the signal READY is set to "H", like in the first preferred embodiment.

In the initial state, when the clock signal CLOCK rises to "H", the pulse signal S16 generates a pulse which comes into "H" (change CH1) during a period t3 with this rise as a trigger. The period t3 corresponds to a time period obtained by subtracting a signal propagation time of the inverter G35 from a signal propagation time of the inverters G31 to G34.

When a pulse of "H" of the pulse signal P16 is applied to the gate of the NMOS transistor Q1, the NMOS transistor Q1 is turned on and the node N13 is immediately set to "L", whereby the signal XDEC rises to "H" (change CH2).

In parallel with this, the latch circuit 17 receiving the pulse signal S16 of "H" latches the pulse signal S16 and changes the latch signal S17 from "H" to "L" on the basis of the pulse signal S16 of "H". As a result, the signal XDEC which is obtaining by propagating the latch signal S17 through the inverter G11 is stabilized to "H".

On the other hand, when the node N13 is set to "L", the precharge control signal PC and the sense amplifier activation signal SE rise to "H".

Even when the generation of the "H" pulse of the pulse signal S16 is terminated and the pulse signal S16 returns to "L", the latch circuit 17 is in a data holding state to sustain the latch signal S17 of "L" because the signal READY takes "H" (an output of the inverter G40 takes "L").

Then, after the delay time ΔT1 passes from the rise of the signal XDEC, the signal READY falls to "L" (change CH3) by the delay circuit 5.

The precharge control signal PC and the sense amplifier activation signal SE fall to "L" with the fall of the signal READY to "L" as a trigger.

On the other hand, when a pulse of "L" of the signal READY is applied to the gate of the PMOS transistor Q2, the PMOS transistor Q2 is turned on and the node N13 is immediately set to "H", whereby the signal XDEC falls to "L" (change CH4).

In parallel with this, the data holding state of the latch circuit 17 is released by the fall of the signal READY to "L"

and the latch signal S17 rises to "H" on the basis of the pulse signal S16 of "L". As a result, the signal XDEC stably sustains "L".

The signal READY rises to "H" (change CH5) immediately after the fall of the signal XDEC. Even when the signal READY is returned to "H", the latch circuit 17 comes into a data holding state to sustain the latch signal S17 of "H" because the pulse signal S16 takes "L". Therefore, the signal XDEC sustains "L". In other words, the signal XDEC comes into "L" and the signal READY comes into "H", returning to the initial state. After that, in synchronization with the rise of the clock signals CLOCK to "H", the above operation is repeated.

Thus, the timing generation circuit of the third preferred embodiment generates the operation control signals (the signals XDEC, PC, SE and WE) by using the latch circuit 17 consisting only of the NOR gates depending only on the rising edge of the clock signal CLOCK, and produces the same effect as discussed in the first preferred embodiment.

The Fourth Preferred Embodiment

Figure 9:
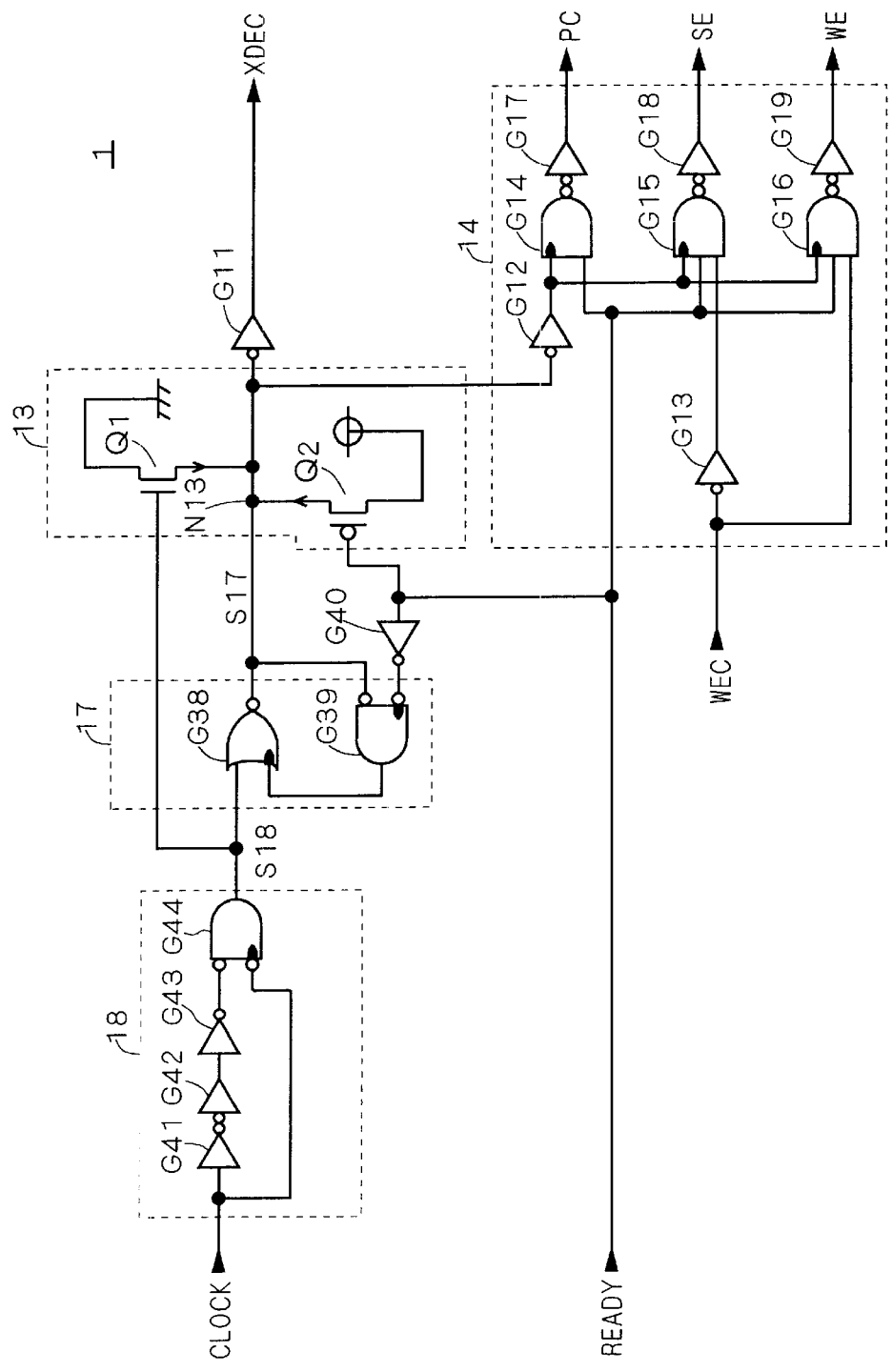
FIG. 9 is a circuit diagram showing an internal configuration of a timing generation circuit in accordance with a fourth preferred embodiment of the present invention.

FIG. 9 is a circuit diagram showing an internal configuration of a timing generation circuit in a RAM in accordance with the fourth preferred embodiment of the present invention. Further, the overall constitution is the same as that of the first preferred embodiment shown in FIG. 1, except the timing generation circuit.

As shown in FIG. 9, the timing generation circuit 1 comprises a pulse generation circuit 18, the latch circuit 17, the high-speed path circuit 13, the control signal generation circuit 14 and the inverters G11 and G40 for signal level control.

The pulse generation circuit 18 consists of inverters G41 to G43 and a NOR gate G44. The inverters G41 to G43 are connected in series and an input of the inverter G41 receives the clock signal CLOCK. One input of the NOR gate G44 receives an output from the inverter G43 and the other input receives the clock signal CLOCK. An output of the NOR gate G44 is outputted as a pulse signal S18 to the latch circuit 17 and the high-speed path circuit 13.

The latch circuit 17, the high-speed path circuit 13 and the control signal generation circuit 14 are the same as those of the third preferred embodiment shown in FIG. 7, and discussion thereof will be omitted. The latch circuit 17 and the high-speed path circuit 13, however, receives the pulse signal S18, instead of the pulse signal S16.

Figure 10:
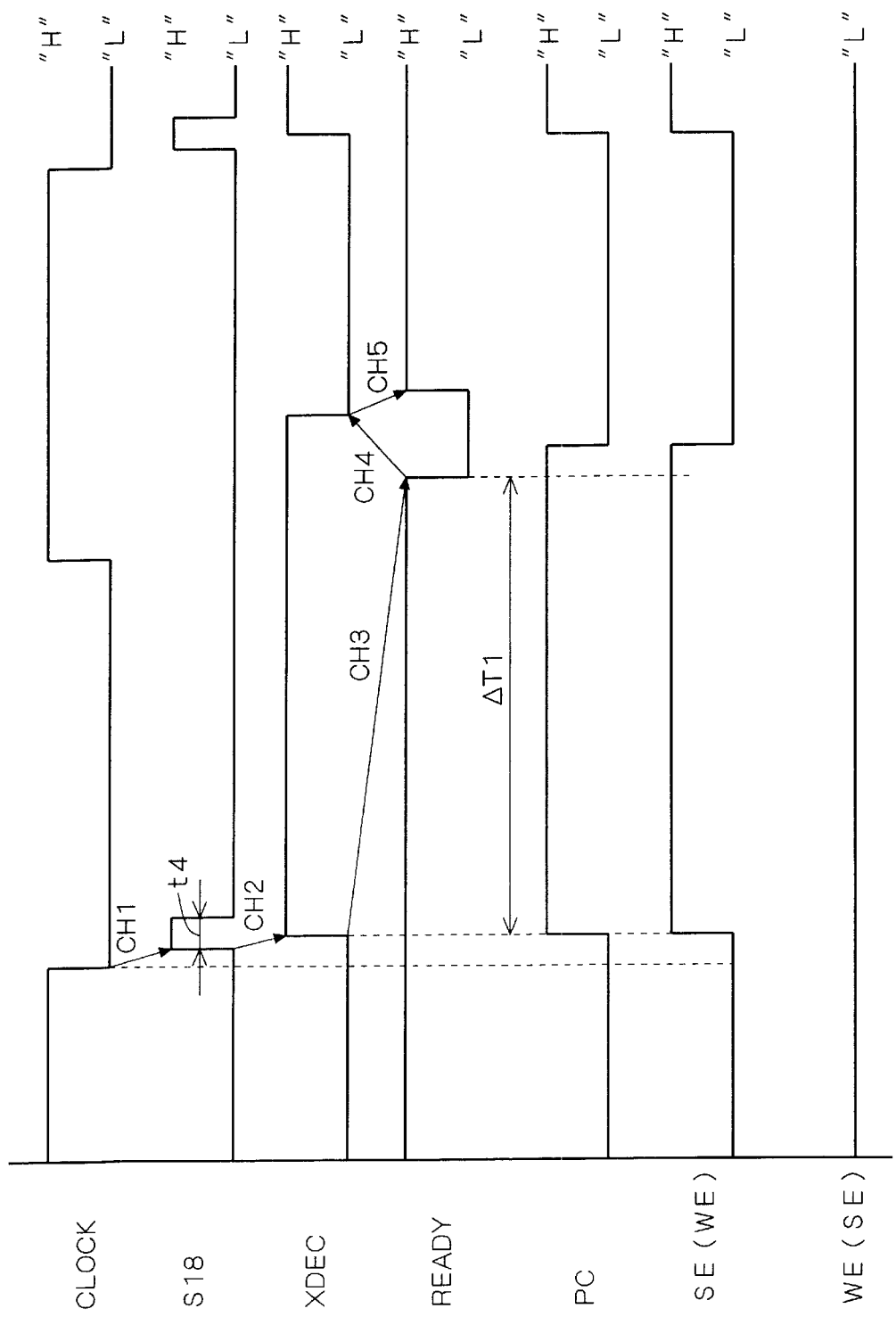
FIG. 10 is a timing chart showing a control signal generating operation of the timing generation circuit in accordance with the fourth preferred embodiment of the present invention.

FIG. 10 is a timing chart showing a control signal generating operation of the timing generation circuit in accordance with the fourth preferred embodiment of the present invention. Referring to FIG. 10, an operation of the timing generation circuit of the fourth preferred embodiment will be discussed below.

First, in an initial state, the signal XDEC is set to "L" and the signal READY is set to "H", like in the third preferred embodiment.

In the initial state, when the clock signal CLOCK falls to "L", the pulse signal S18 generates a pulse which comes into "H" (change CH1) during a period t4 with this fall as a trigger. The period t4 corresponds to a signal propagation time of the inverters G41 to G43.

When a pulse of "H" of the pulse signal P18 is applied to the gate of the NMOS transistor Q1, the NMOS transistor Q1 is turned on and the node N13 is immediately set to "L", whereby the signal XDEC rises to "H" (change CH2).

In parallel with this, the latch circuit 17 receiving the pulse signal S18 of "H" latches the pulse signal S18 and changes the latch signal S17 from "H" to "L" on the basis of the pulse signal S18 of "H". As a result, the signal XDEC which is obtaining by propagating the latch signal S17 through the inverter G11 is stabilized to "H".

After that, the same operation as shown in FIG. 8 of the third preferred embodiment is performed, except that the pulse signal S16 are replaced by the pulse signal S18.

Thus, the timing generation circuit of the fourth preferred embodiment generates the operation control signals (the signals XDEC, PC, SE and WE) by using the latch circuit 17 consisting only of the NOR gates depending only on the falling edge of the clock signal CLOCK, and produces the same effect as discussed in the first preferred embodiment.

While the invention has been shown and described in detail, the foregoing description is in all aspects illustrative and not restrictive. It is therefore understood that numerous modifications and variations can be devised without departing from the scope of the invention.

What is claimed is:

1. A semiconductor integrated circuit, comprising:

a control unit for generating an operation control signal in synchronization with a clock signal;

an operation unit for operating on the basis of said operation control signal, wherein said control unit outputs said operation control signal which is timing-controlled only by a single predetermined kind of signal shift of said clock signal.

2. The semiconductor integrated circuit according to claim 1, wherein said control unit comprises a pulse generation circuit receiving said clock signal, for generating a pulse signal taking a first level or a second level, said pulse signal coming into said first level for a predetermined period from said single predetermined kind of signal shift of said clock signal;

a latch circuit receiving said pulse signal, for outputting a latch signal having a signal value based on said first level in response to said pulse signal of said first level, and after that coming into a data holding state for a predetermined period to hold said signal value of said latch signal regardless of the level of said pulse signal; and a control signal generation circuit for generating said operation control signal on the basis of said latch signal.

3. The semiconductor integrated circuit according to claim 2, wherein said control unit further comprises an operation control signal high-speed setting circuit for making said control signal generation circuit generate said operation control signal which is generated by said control signal generation circuit in response to said latch signal in advance before said control signal generation circuit is driven by said latch signal, when said pulse signal takes said first level.

4. The semiconductor integrated circuit according to claim 2, wherein said control unit further comprises an auxiliary signal outputting circuit for outputting an auxiliary signal on the basis of said operation control signal, and said latch circuit releases said data holding state when said auxiliary signal takes a predetermined signal value.

5. The semiconductor integrated circuit according to claim 4, wherein said control unit further comprises an operation control signal high-speed setting circuit for making said control signal generation circuit generate said operation control signal which is generated by said control signal generation circuit in response to said latch signal in advance before said control signal generation circuit is driven by said latch signal, when said auxiliary signal takes said predetermined signal value.

6. The semiconductor integrated circuit according to claim 4, wherein said auxiliary signal outputting circuit includes a delay circuit receiving said operation control signal, for outputting said auxiliary signal of said predetermined signal value on the basis of a delayed signal of said operation control signal.

7. The semiconductor integrated circuit according to claim 1, wherein said operation unit includes a semiconductor memory unit constituted of a memory cell array having a plurality of memory cells arranged in matrix.

8. The semiconductor integrated circuit according to claim 7, wherein said operation control signal includes an operation control signal for selecting said memory cells of said memory cell array.

9. The semiconductor integrated circuit according to claim 3, wherein said operation control signal high-speed setting circuit includes a first transistor having one electrode receiving a fixed potential, the other electrode connected to a node which determines a signal value of said operation control signal, and a control electrode receiving a pulse-related signal which takes a signal value corresponding to a signal value of said pulse signal, and said first transistor comes into an on state when said pulse-related signal takes a signal value set correspondingly to said first level of said pulse signal.

10. The semiconductor integrated circuit according to claim 4, wherein said latch circuit has a first NAND gate and a second NAND gate, said first NAND gate has one input receiving said pulse signal and the other input receiving an output from said second NAND gate and outputs said latch signal, said second NAND gate has one input receiving said latch signal and the other input receiving said auxiliary signal, said first level includes "L" level, and said predetermined level includes "L" level.

11. The semiconductor integrated circuit according to claim 4, wherein said latch circuit has a first NOR gate and a second NOR gate, said first NOR gate has one input receiving said pulse signal and the other input receiving an output from said second NOR gate and outputs said latch signal, said second NOR gate has one input receiving said latch signal and the other input receiving an inverted signal of said auxiliary signal, said first level includes "H" level, and said predetermined level includes "L" level.

12. The semiconductor integrated circuit according to claim 5, wherein said operation control signal high-speed setting circuit includes a second transistor having one electrode receiving a fixed potential, the other electrode connected to a node which determines a signal value of said operation control signal, and a control electrode receiving an auxiliary-related signal which takes a signal value corresponding to a signal value of said auxiliary signal, and said second transistor comes into an on state when said auxiliary-related signal takes a signal value set correspondingly to said predetermined level of said auxiliary signal.

* * * * *